(12) United States Patent
Kraz

(10) Patent No.: US 9,076,806 B1
(45) Date of Patent: Jul. 7, 2015

(54) DEVICE AND METHOD FOR REDUCTION OF OVERSTRESS IN SOLDERING PROCESS

(76) Inventor: Vladimir Kraz, Santa Cruz, CA (US)

( * ) Notice: Subject to any disclaimer, the term of this patent is extended or adjusted under 35 U.S.C. 154(b) by 0 days.

(21) Appl. No.: 13/485,394

(22) Filed: May 31, 2012

(51) Int. Cl.
*H01H 47/00* (2006.01)
*H01L 23/60* (2006.01)
*H01L 23/552* (2006.01)

(52) U.S. Cl.
CPC .............. *H01L 23/60* (2013.01); *H01L 23/552* (2013.01)

(58) Field of Classification Search
USPC .................... 361/117–120, 212, 220
See application file for complete search history.

(56) References Cited

U.S. PATENT DOCUMENTS

| | | | |
|---|---|---|---|
| 4,873,608 A * | 10/1989 | Yoshimura | 361/220 |
| 6,310,557 B1 * | 10/2001 | Nelsen et al. | 340/649 |
| 6,873,516 B1 * | 3/2005 | Epstein | 361/220 |
| 7,119,597 B1 * | 10/2006 | Barrett et al. | 327/291 |
| 2003/0080176 A1 * | 5/2003 | Mayer et al. | 228/102 |
| 2007/0095798 A1 * | 5/2007 | Kraz | 219/85.1 |

OTHER PUBLICATIONS

Farwell, et al., *EOS from Soldering Irons Connected to Faulty 120VAC Receptacles*, 2005 EOS/ESD Symposium, 7 pages, 2005.
IPC-TM-650 Test Methods Manual, 4 pages.
IPC-A-610D Acceptability of Electronic Assemblies Standard, IPC Association Connecting Electronics Industries, 404 pages, Feb. 2005.

* cited by examiner

*Primary Examiner* — Danny Nguyen
(74) *Attorney, Agent, or Firm* — DLA Piper LLP (US)

(57) ABSTRACT

A device and a method of reducing high-frequency currents between the tip of the soldering iron and the circuit board are described. In one embodiment, a special EMI filter and a method of it implementation in soldering process is described. This device and this method of implementation provide significant reduction of high-frequency current to the sensitive components. Another embodiment describes an implementation of EMI-reducing filter inside the soldering iron. Yet other embodiments include implementation of EMI-reducing filter as a part of the solder station, of the vise holding the circuit board, of the solder spool holder and as a stand-alone device.

35 Claims, 17 Drawing Sheets

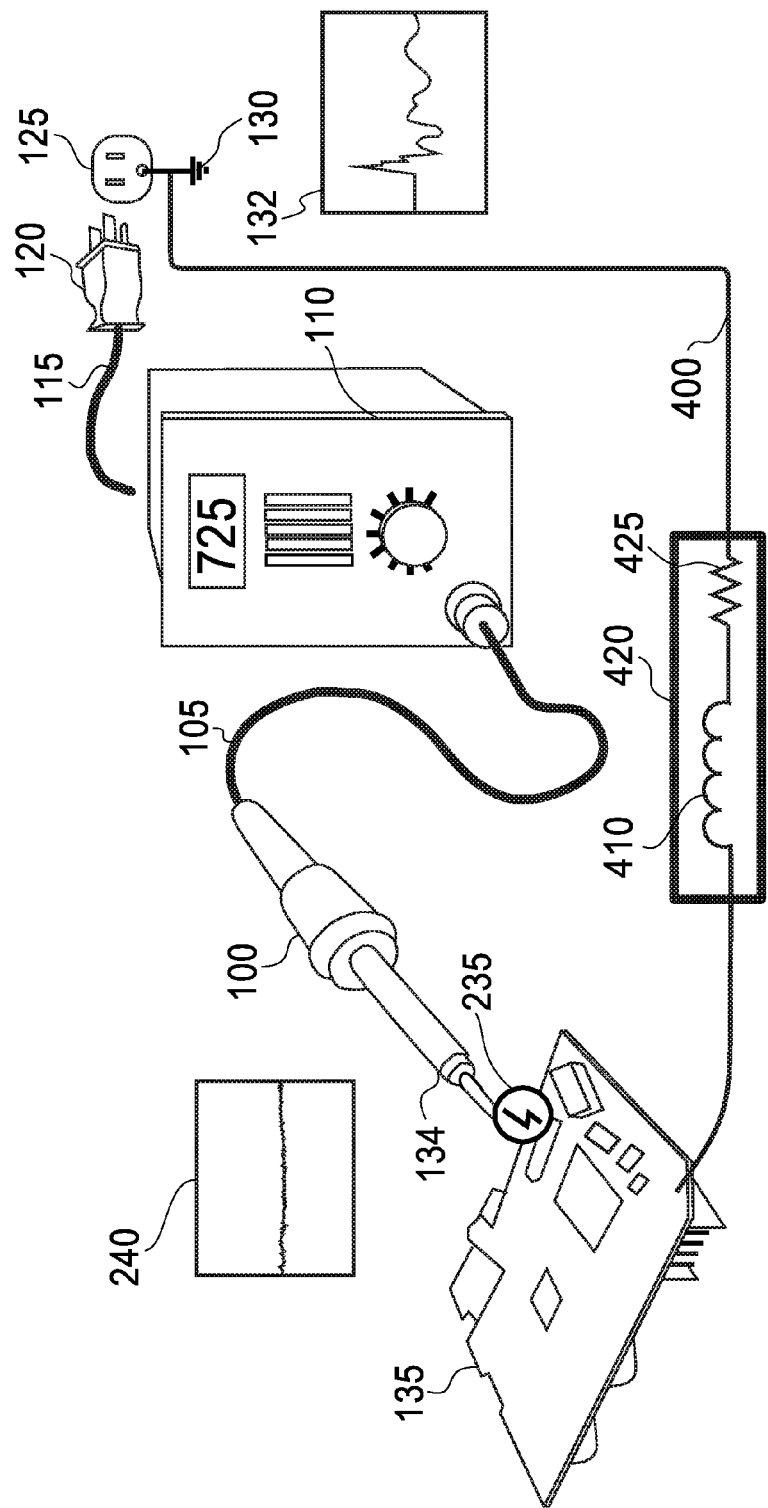
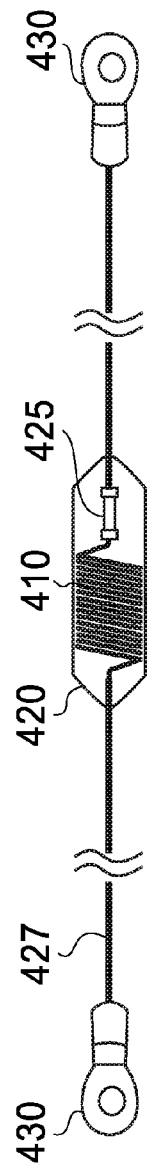
Figure 7A
Figure 7B

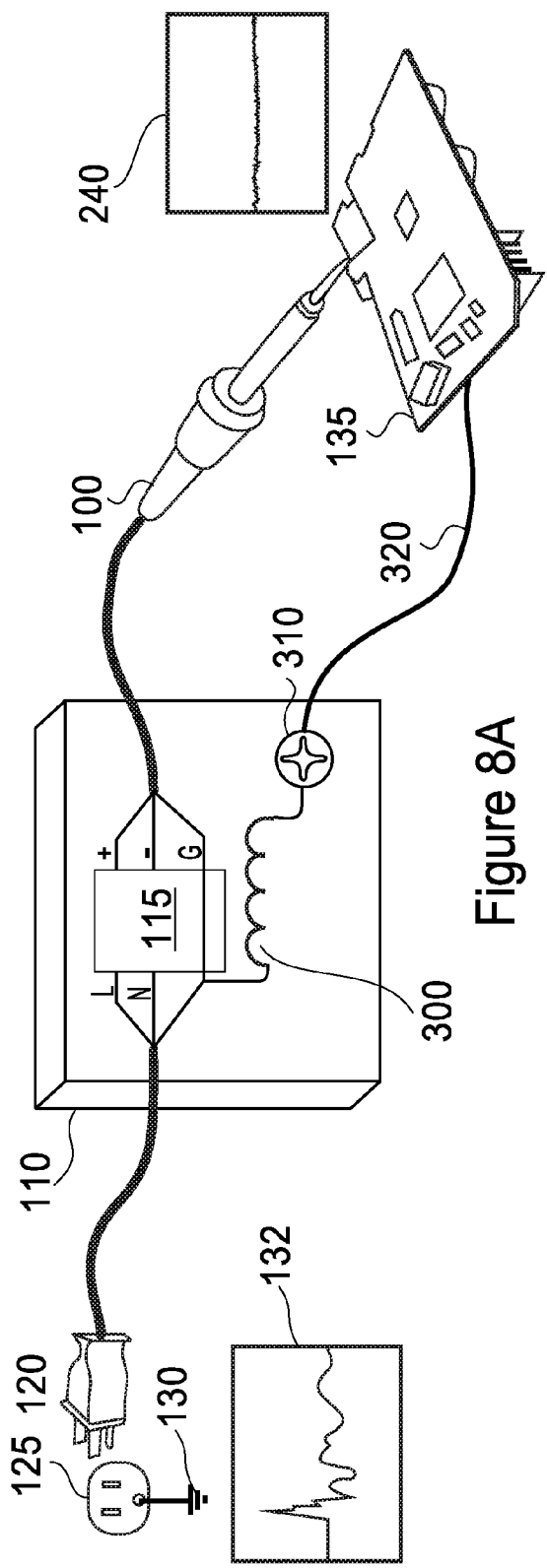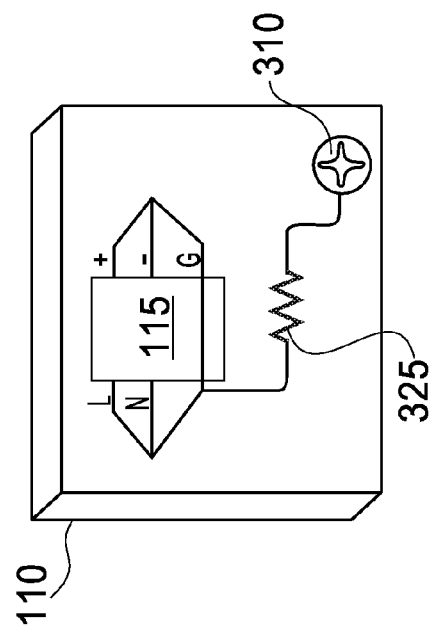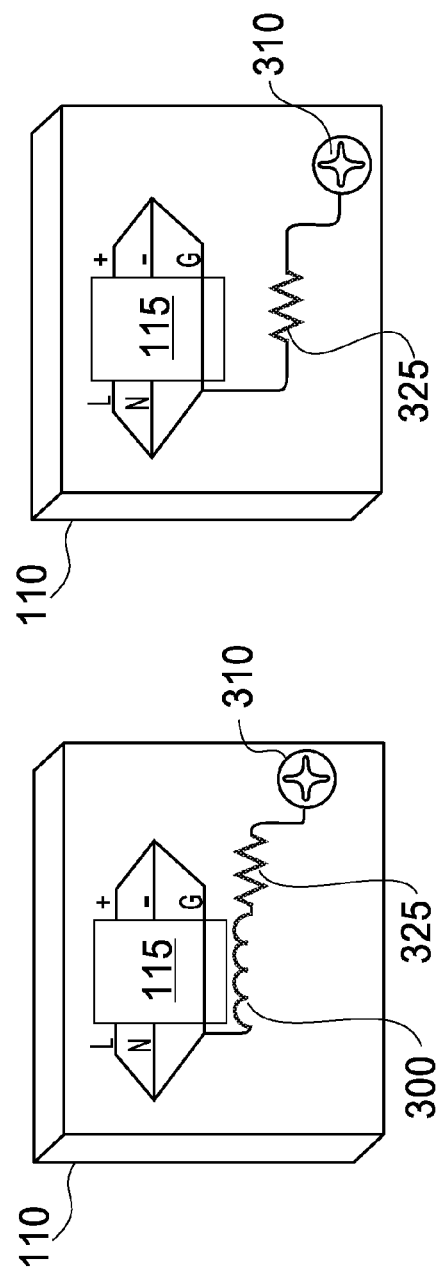
Figure 8A
Figure 8B
Figure 8C

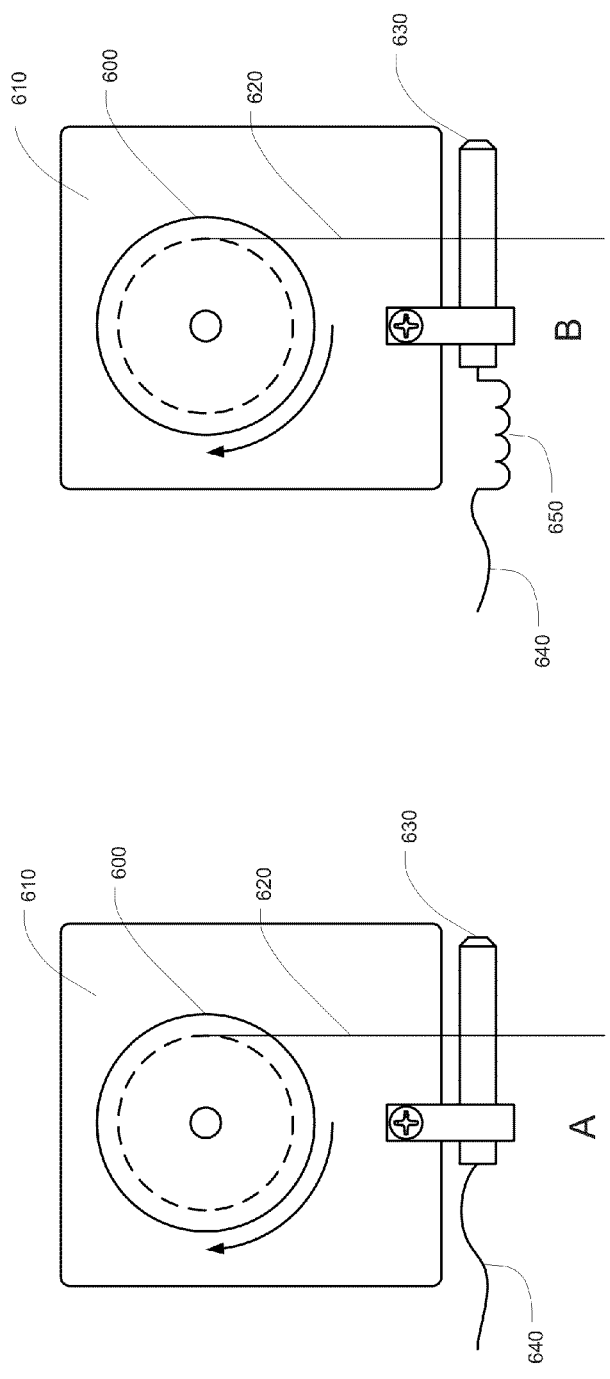
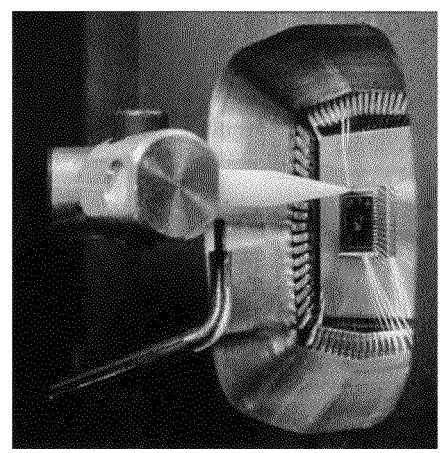
Figure 15

DEVICE AND METHOD FOR REDUCTION OF OVERSTRESS IN SOLDERING PROCESS

FIELD

The disclosure generally relates to a device, system and method of reducing electrical overstress in soldering process involving soldering irons and similar soldering equipment, both manual and automated.

BACKGROUND

Soldering of electronic circuits involves physical contact between conductive tip of soldering iron and electronic components, often with low threshold of damage by excessive electric currents causing condition called electrical overstress ("EOS"). It is desirable to provide a device and method that deals with reduction of specific type of EOS caused by transient currents with high-frequency spectral content. Such industry regulatory documents as IPC-A-610 and IPC-TM-650-2.5.33.2 provide limits to the magnitude of such transient signals.

These transient signals are caused by noise on power lines and by the soldering iron itself. The latter is becoming a lesser issue with time as the quality of soldering irons, especially of professional grade, improves. The electrical noise on power lines and ground in manufacturing facility, however, is not decreasing, largely due to increasing number of electrical and electronic equipment in manufacturing environment where each such device generates noise on power lines and ground. A typical soldering setup is depicted in FIG. 1. Soldering iron 100 is connected by cable 105 to the soldering station 110. Said station in turn is plugged via cable 115 and electrical plug 120 into a power outlet 125. Said power outlet is grounded to a facility electrical ground 130. Noise on power lines 132 shown in a screenshot of an oscilloscope (not shown) creates corresponding voltage on the tip 134 of said soldering iron. The circuit board 135 being assembled is also connected to ground 137 which may or may not be the same as said ground 130. In presence of noise on power lines and ground there may be a current 140 between the tip of said soldering iron and said circuit board shown as screenshot 145. This current can cause damage to the electronic components as described in "EOS from Soldering Irons Connected to Faulty 120 VAC Receptacles," Raytheon, W. Farrel et. al. ESD Symposium Proceeds, 2005.

FIG. 2 shows slightly modified arrangement also common in electronic assembly environment. As seen, said circuit board is not grounded directly, but is placed on a static-dissipative mat 146 which in turn is connected to said ground 137 often via the resistor 147. Even though this arrangement may prevent high current from the iron as long as this current is either DC or of very low frequency, such as that of mains (50/60 Hz), the inevitable parasitic capacitance 148 between said board 135 and said ground 137 makes impedance for high-frequency transient signals from the tip of the iron very low which allows for high currents.

The nature of such electrical overstress becomes evident in analysis of FIG. 3. In FIG. 3 said plug 120 of said soldering iron station 110 connects to said electrical outlet 125. Said outlet is, in turn, connected to the mains power lines live (L) 150, neutral (N) 155 and said ground (G) 130. Mains typically have high-frequency noise comprised mostly of transient signals shown here as differential voltage (between live and neutral) 170 and common mode noise (between live/neutral and ground) 175 and 180 accordingly. Said mains lines have inherent distributed impedance comprised of inductance 185, resistance 190, and distributed capacitance 195 between all the lines. Similar distributed impedance is present to some extend in all wires shown in FIG. 2. Said soldering station 110 is typically comprised of AC to DC converter 200 that lowers the mains voltage to typically 12V or 24V and then converts this AC voltage to DC. Said soldering station also typically has temperature control mechanism 205. Said soldering station is connected via said cable 105 to a heating element 210 enclosed in a ceramic element 215 which, in turn, is thermally connected to said soldering tip 134. The soldering station 110 by itself can be a generator of high-frequency transient signals 220, though the noise from power line and ground is typically substantially higher. Parasitic capacitance 222 between input and output of said solder station 110 serves as conduit of noise between the power line and output. Parasitic capacitance 223 between the heating element and the solder tip serves as conduit for noise to said tip. The description below addresses only the arrangement of FIG. 1 for simplicity and brevity of this disclosure. It should be noted that the arrangement of FIG. 2 behaves substantially the same.

Said circuit board 135 to which the soldering iron solders components to is grounded for the purposes of protection against electrostatic discharge (ESD). The grounding wire 225 possesses said distributed resistance 195 and inductance 200 similar to other cables. Said grounding wire is eventually connected to the facility ground 130. Factory ground usually contains high-frequency noise shown in this figure as a noise source 230 caused by a number of factors, including leakage current from live and neutral wires and inductive and capacitive coupling with the said wires.

Difference in voltage between said tip 134 and said circuit board 135 causes high-frequency current 235 with the waveform shown in the screenshot 240. This current can be quite high. FIG. 4 shows the results of measurements. FIG. 4a depicts the test setup where the parts of it are similar to those of FIG. 1. A current sensor 230 with the wire 232 that is used to measure current is connected between said tip 134 of said iron 100 and the grounded circuit board 135. Said current probe is connected via cable 234 to a high-speed digital storage oscilloscope 236. Another channel of said oscilloscope is connected via cable 238 to a high-voltage adapter 240 plugged into the said mains outlet 125. Said adapter provides safe means for said oscilloscope to measure high-frequency signals on high-voltage power lines.

The setup in FIG. 4a allows for simultaneous measurements of both high-frequency signals on the mains and the current between the tip of soldering iron and the circuit board. FIG. 4b depicts a screenshot of said oscilloscope. As seen, the transient signal on the mains (Channel 2) is perfectly synchronized with the current spike shown on Channel 1. Said current probe 220 has conversion factor of 5 mV/mA, meaning that 5 mV of signal on the screen corresponds to 1 mA of current. As shown, the peak current is 18.8 mA which is very high for sensitive components.

FIG. 5a depicts an attempt to mitigate high current problem by including a typical power line EMI (electromagnetic interference) filter 250 connected between said power lines and said soldering station. The schematic of the filter shown is for example only—it shows that the filter has both common-mode and differential-mode filtering, i.e. typically complete set of filters for reduction of noise on power lines. Ground of said circuit board is connected to ground in the same way as in FIGS. 1, 2, 3 and 4. FIG. 5b depicts the results. The measurement setup is the same as in FIG. 4a. Similarly to FIG. 4b, there is current 235 between the tip of the soldering iron that is synchronized to the noise on the mains. The signal is quite different, though. While it is lower in maximum value, the waveform now contains frequencies not present before. This correlates with the investigation on the subject (EOS from Soldering Irons Connected to Faulty 120 VAC Receptacles, W. Farwell et al., Raytheon, ESDA Symposium 2005). As seen in this paper, simply inserting a conventional EMI filter between the power line and the soldering station does not present a satisfactory solution of significantly reducing current between the tip of the iron and the circuit board.

It is desirable to have a practical solution that greatly reduces high-frequency current between the tip of the soldering iron or other tools and sensitive components on the circuit board, thus protecting these components from electrical overstress. It is also desirable and often required by various regulations, including safety regulations, to have low resistance to ground for DC and 50/60 Hz signals as specified by numerous standards and regulations, including but not limited to: IPC-TM-650, MIL-STD-2000, ANSI ESD DS 13.1 and others.

BRIEF DESCRIPTION OF THE DRAWINGS

FIGS. 7A and 7B illustrate the advantages of the device and method where the circuit board is connected to the soldering station via ground filter;

FIGS. 8A-8C show one of the embodiments of the device where a ground filter is built into the soldering station body with the terminal for grounding the circuit board;

FIG. 13 shows a vise for circuit board with ground filter built-in;

FIG. 14 depicts a stand for spool of solder with ground filter built-in;

FIG. 15 shows use of a ground filter in wire bonding equipment;

DETAILED DESCRIPTION OF ONE OR MORE EMBODIMENTS

The disclosure is particularly applicable to a soldering process, including manual soldering. It is also applicable to any process involving electrical contact with sensitive electronic components and circuits. It will be appreciated, however, that the device and method in accordance with the device and method has greater utility since the device and method may be integrated with/used with a variety of different electronic assembly and semiconductor manufacturing tools. For example, the device with the filter and method can be used with tools other than soldering iron, such as power screwdrivers, a vise for a circuit board, a stand for a spool of solder, a piece of wire bonding equipment, an electronic workbench, etc. and any other device that would benefit from reducing EOS. Each of these is an electronic component tool.

A device and a method of reducing high-frequency currents between the tip of the soldering iron and the circuit board are described. In one embodiment of the device, a special electromagnetic interference ("EMI") filter and a method of implementation of the filter in the soldering process is described. This device and this method of implementation provide significant reduction of high-frequency current to the sensitive components. Another embodiment describes an implementation of EMI-reducing filter inside the soldering iron. Yet other embodiments include implementation of EMI-reducing filter as a part of the solder station, of the vise holding the circuit board, of the solder spool holder and as a stand-alone device.

Figure 1:
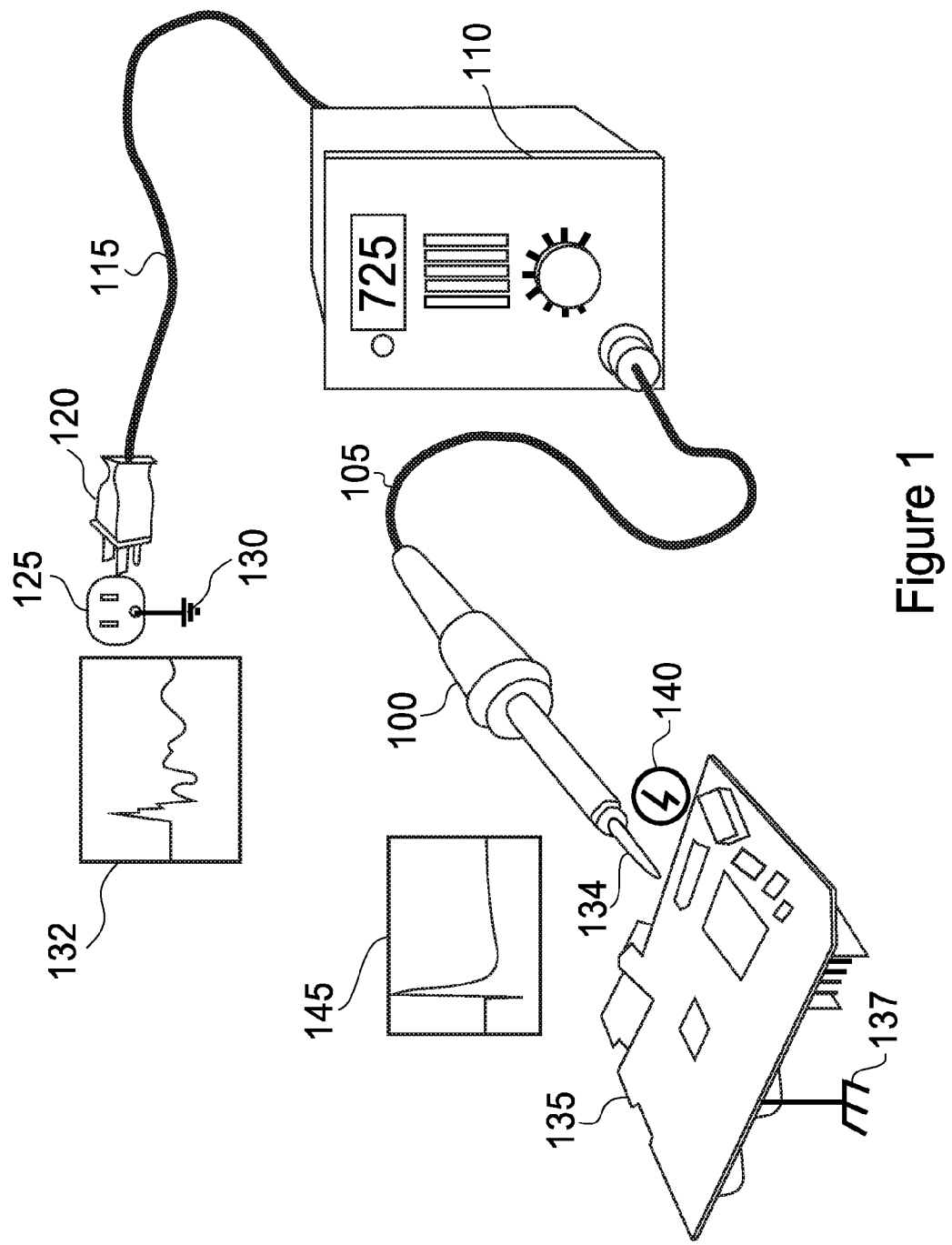
FIG. 1 is a depiction of a typical soldering setup used in the industry.
Figure 2:
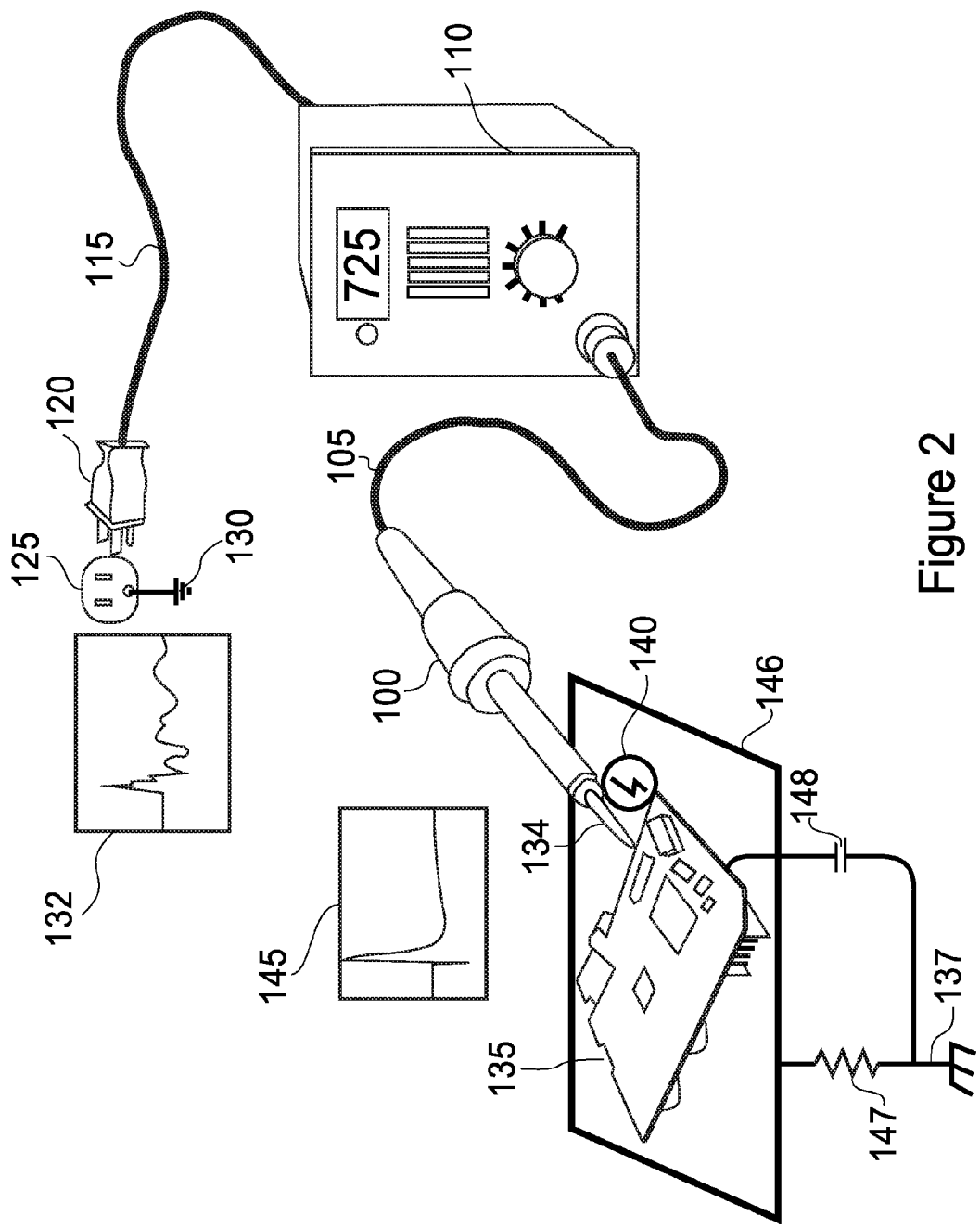
FIG. 2 depicts a variation of a typical soldering setup involving a static-dissipative surface.
Figure 3:
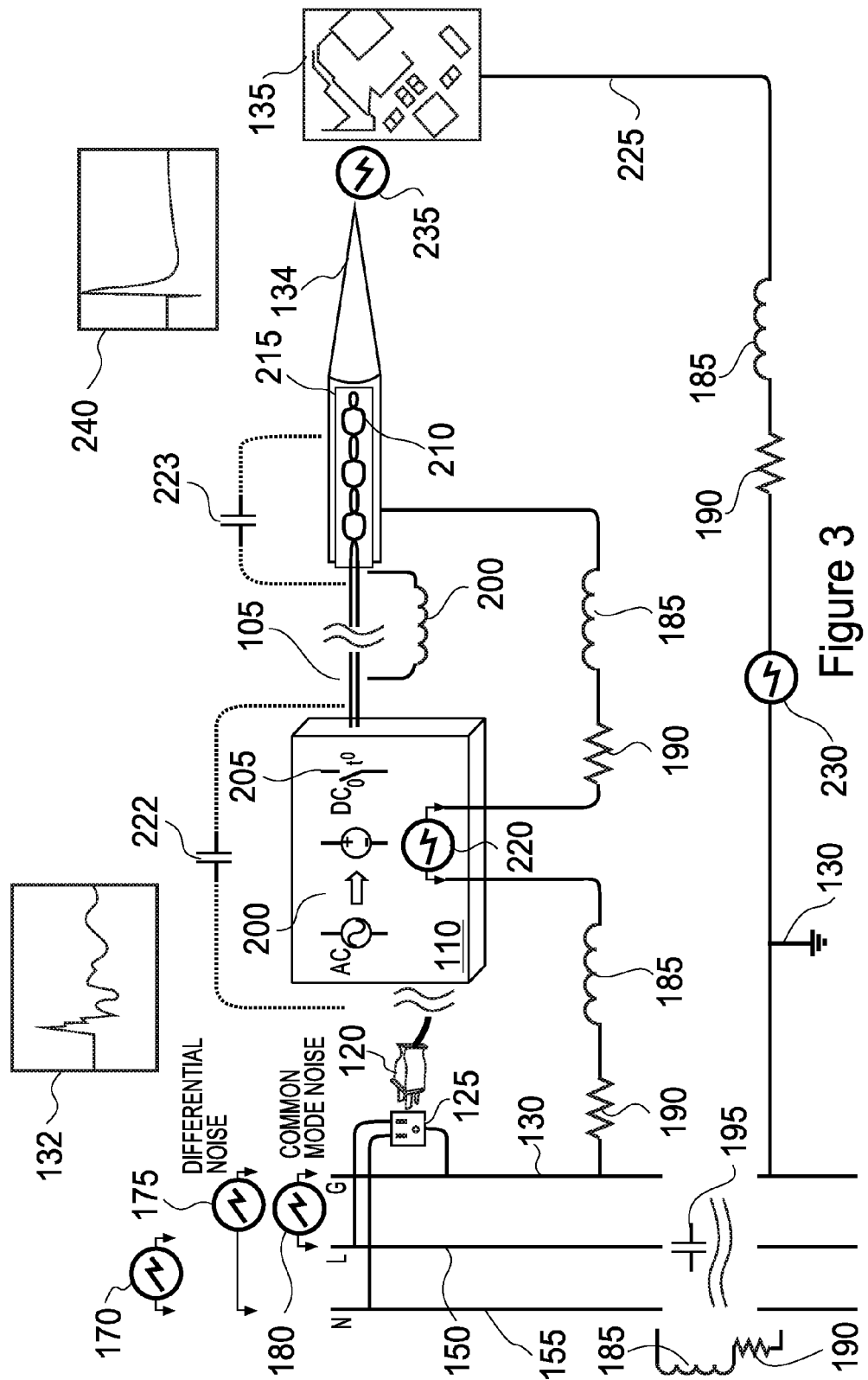
FIG. 3 shows equivalent electrical schematic of the soldering iron setup shown in FIG. 1 for high-frequency signals.
Figure 4B:
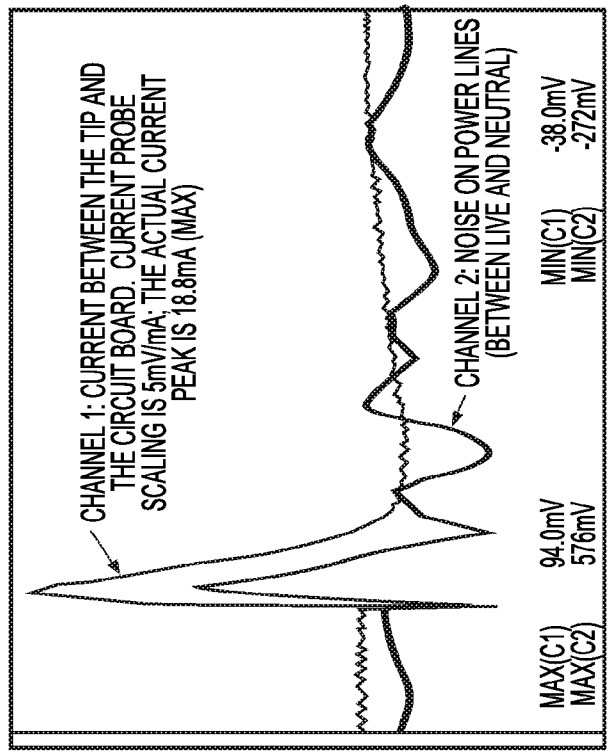
FIG. 4 shows a setup for measurements of high-frequency electrical overstress current in soldering.
Figure 4A:
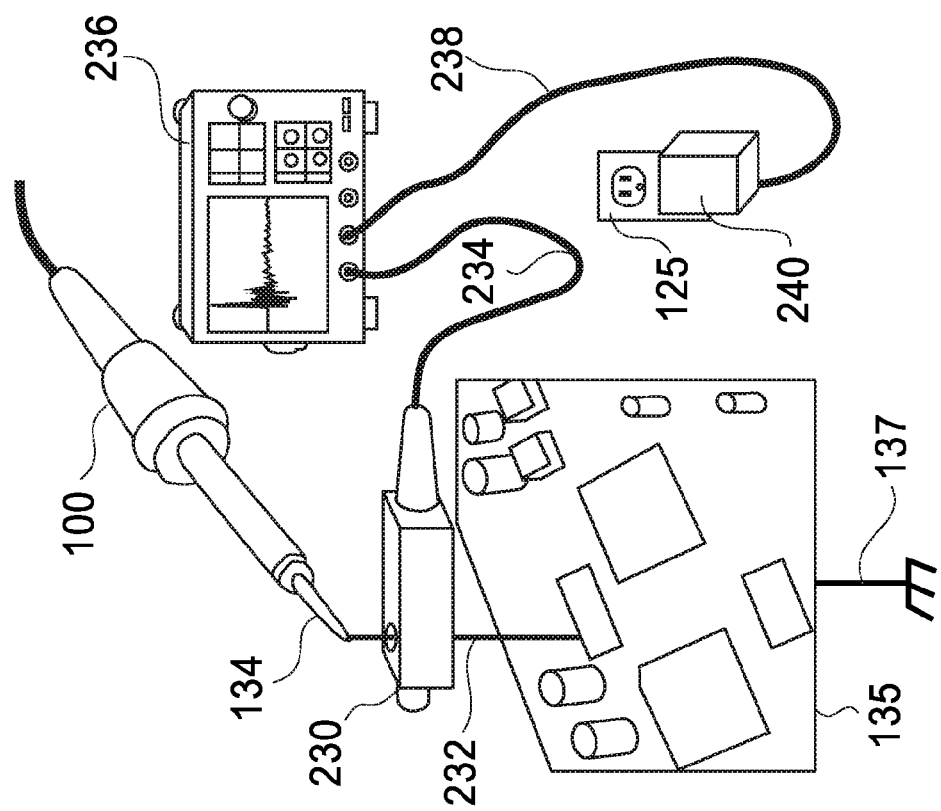
Figure 5:
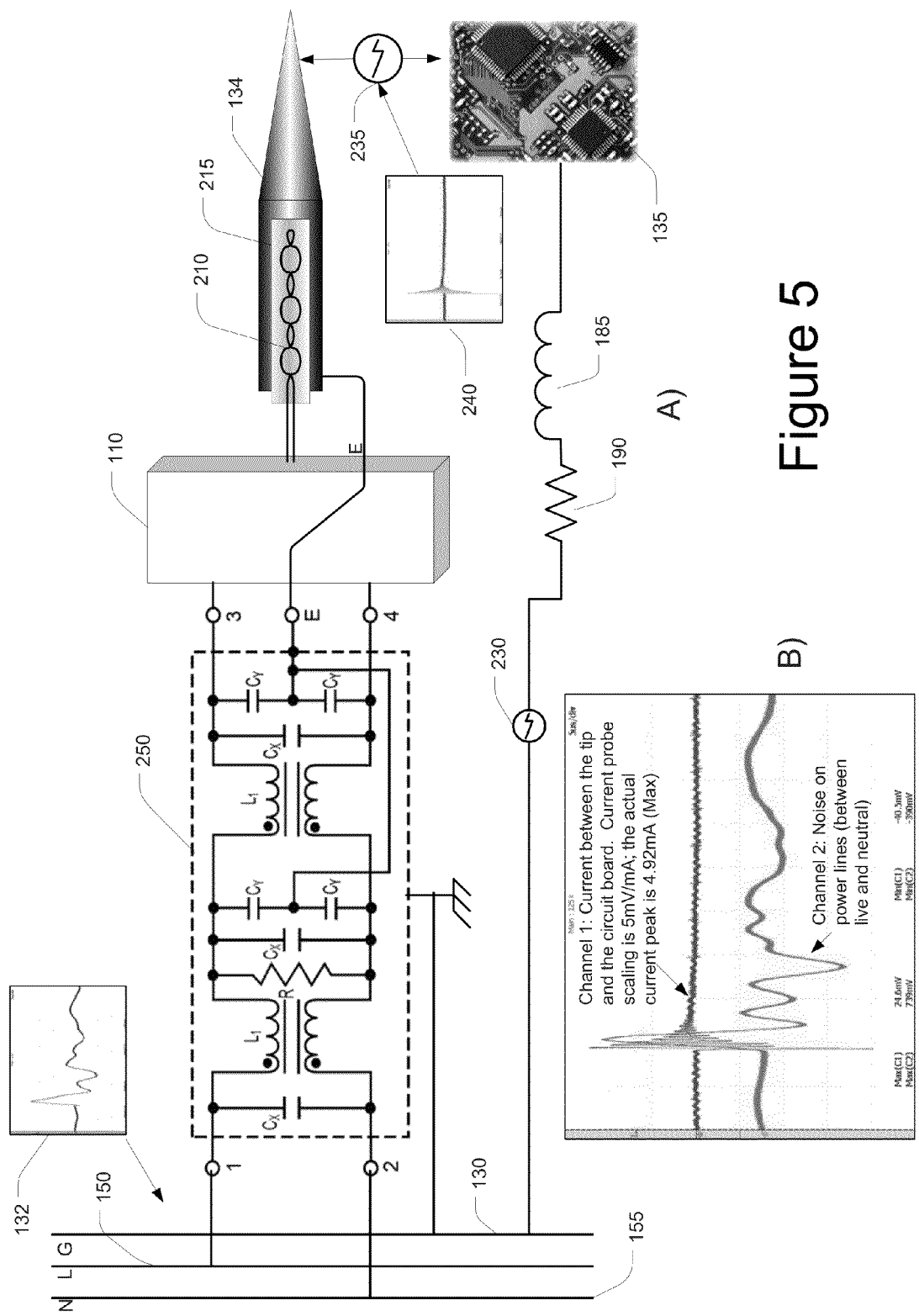
FIG. 5 depicts circuit diagram of a soldering iron with regular power line EMI filter and the measurement results.
Figure 6:
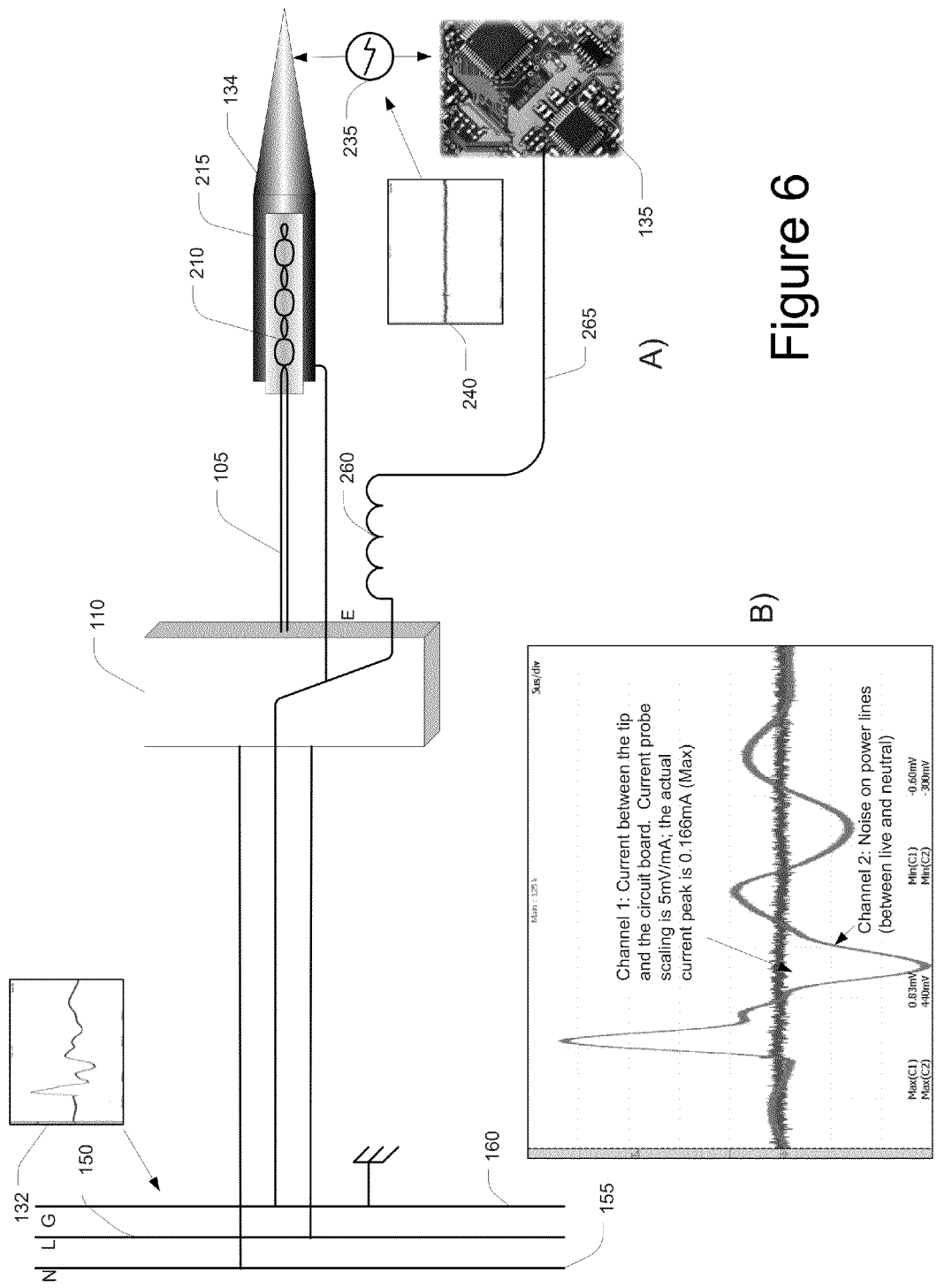
FIG. 6A shows a method of connecting a circuit board to ground via a soldering iron station.
FIG. 6B illustrates measurements for the method in FIG. 6A.

FIG. 6A shows a method of connecting a circuit board 135 to ground in accordance with an implementation of the device. The circuit board 135 is grounded not to a separate facility ground but to a soldering iron station 110 using a ground filter 260 by a conductor 265, such as a wire. The connection to the soldering station 110 shortens the ground wire and therefore reduces reactance of the impedance components 185 and 190 of FIG. 5 and also reduces pickup of ambient radiated electromagnetic fields due to smaller antenna factor of wire 265. The ground filter 260 is, in one implementation, an inductor with sufficient inductance to have high impedance at high frequencies and sufficient wire gauge to have low resistance at DC and low frequencies (50/60 Hz) so as not to facilitate unnecessary rise in voltage at these frequencies. Because the impedance of the inductor is directly proportional to frequency ($X_L=2\pi fL$), current between the soldering iron 134 and the circuit board 135 will be significantly reduced. FIG. 6b shows the actual data taken in this arrangement. Noise on power line is substantially the same as in previous setups (FIGS. 4 and 5). As seen, with the inductance 260 of 3 mH (milliHenries) the current 210 is only 0.166 mA (as compared to 4.9 a mA in the convention system in FIG. 5) which is quite negligible and safe for even the most sensitive electronic components today.

FIG. 7A depicts practical implementation of the device in FIG. 6a. As shown in FIG. 7, a ground filter 410 is shown as an inductor that is enclosed in a case 420 and can be either stand-alone or hard-wired/molded in the ground cable 400. An optional current-limiting resistor 425 similar to sometimes used configuration for ESD environment, such as Desco cable p.n. 09818 (http://www.desco.com/Search/09818) can be connected in series with said ground filter. It should be noted that the resistor alone may not be as effective in limiting high frequency current as the inductor due to parasitic capacitance. In addition, the resistor negates low-resistance to ground requirements for most equipment. However, in some applications, such as connection to static-dissipative surfaces resistors are admissible.

FIG. 7B shows a practical embodiment of configuration of FIG. 7a where the ground filter 410 is enclosed in a protective cover 420 and is wired with wires 427 with optional termination means 430. An optional resistor 425 can be used for certain applications where current-limiting resistor is either admissible or required. Said protective cover 420 can be made of any electrically insulating material, such as plastic enclosure, heat shrink tubing, etc.

Figure 9:
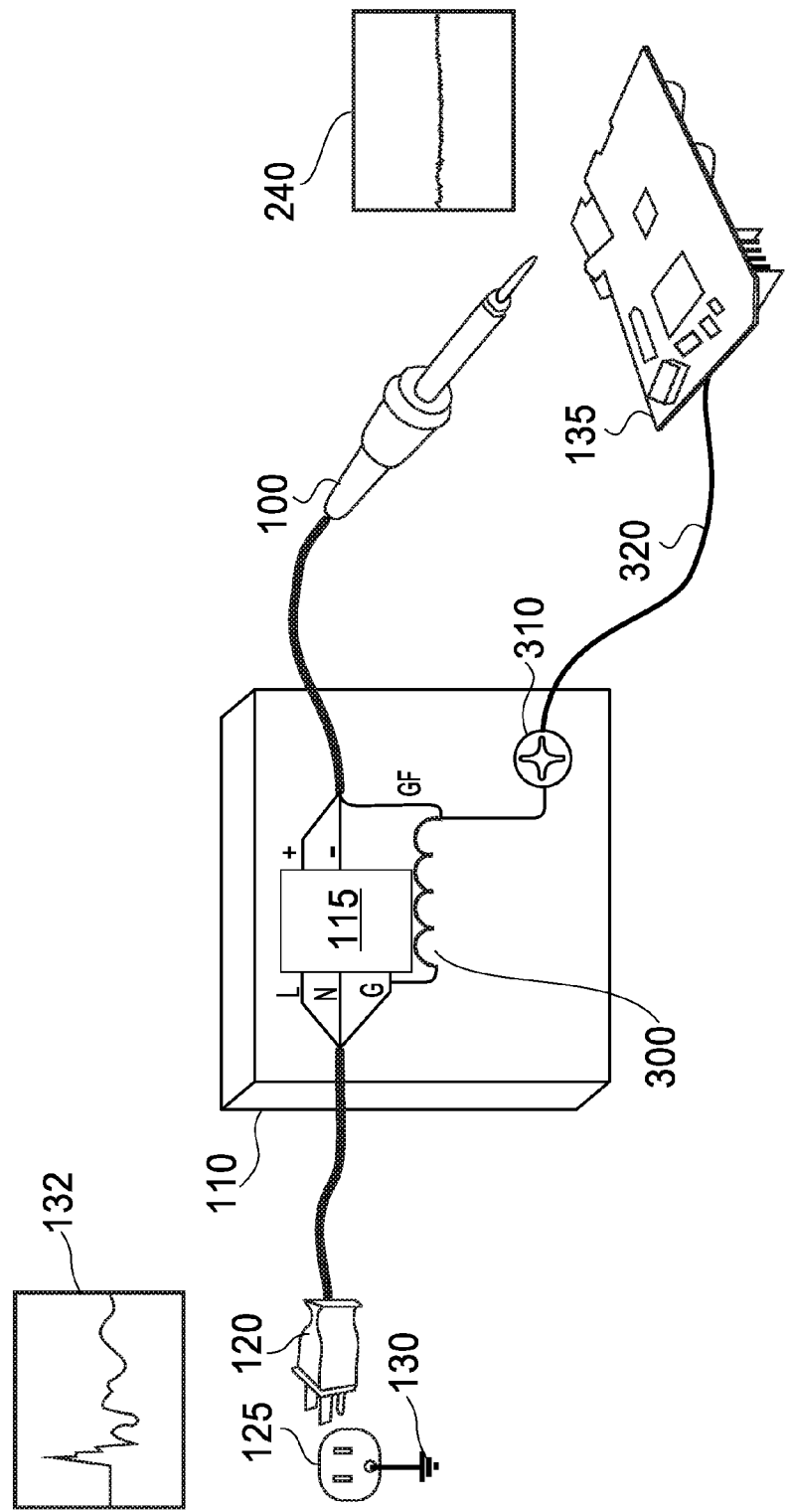
FIG. 9 depicts yet another embodiment of the device where both a soldering iron and the circuit board are both connected to ground via the same ground filter.

FIGS. 8A-8C depict several embodiments of the device. In the embodiment of FIG. 8a, the ground filter 300 is built into the soldering station 110 and its output is connected to a terminal 310 to which a circuit board' ground 320 is connected. This way grounding of the circuit board becomes easy while preserving all the benefits of short ground wires and reduced high-frequency current as described in FIG. 6. FIG. 8b depicts the embodiment of FIG. 6A with the addition of resistor 325 in series with said inductor 300 to add current limiting function. FIG. 8c shows the device with only a current-limiting resistor 325 inside the solder iron base for those cases where use of ground filter is not feasible, such as extremely limited physical space available. FIG. 9 presents yet another embodiment of the device where ground of both the soldering iron 100 and the circuit board 135 passes through a ground filter 300 built into the soldering station 110. This further reduces high-frequency overstress currents between the tip and the circuit board. In this embodiment, a grounding wire of the soldering iron inside of the station is coupled to a grounding wire of the ground filter.

Figure 10:
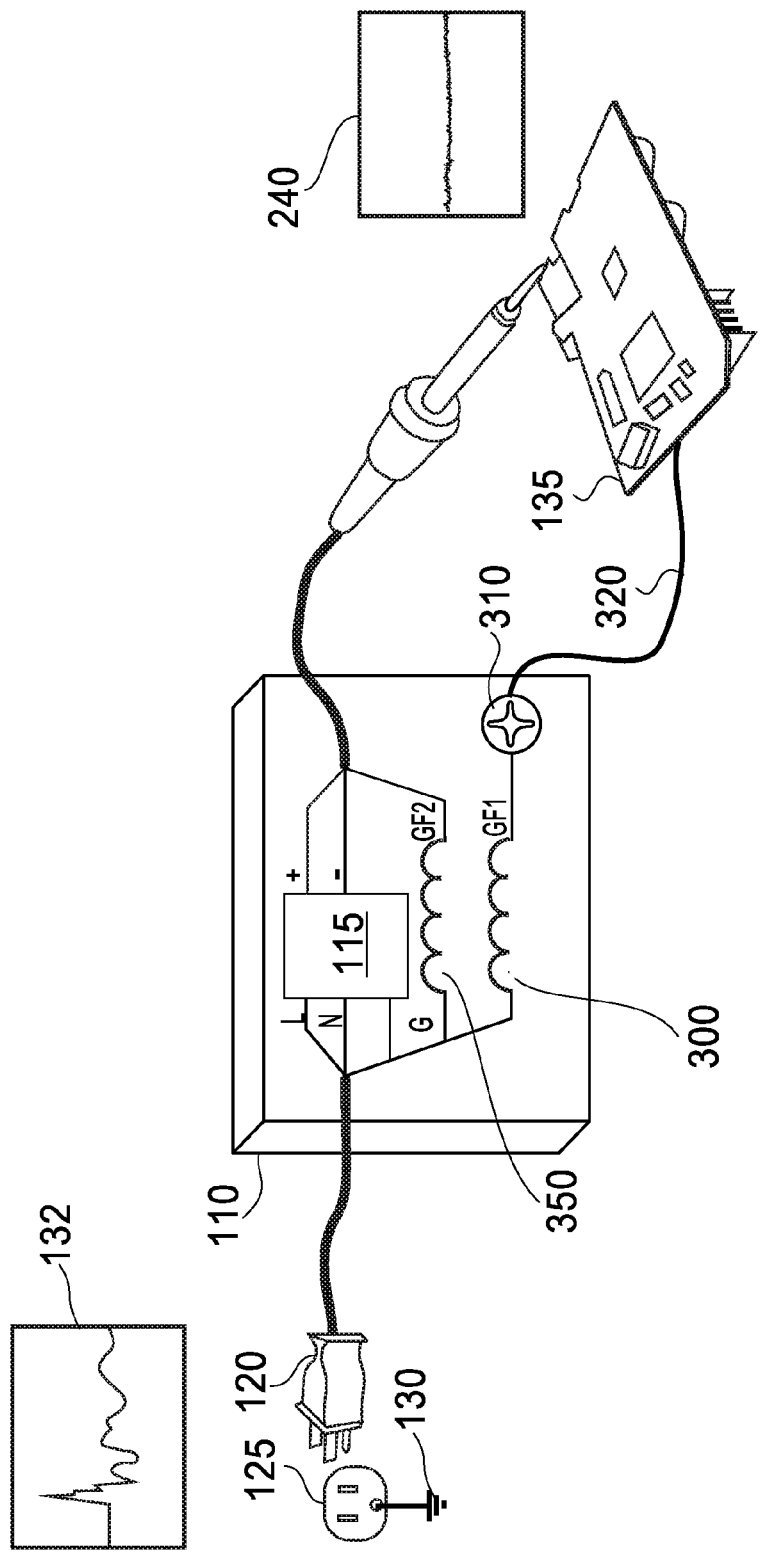
FIG. 10 shows the soldering iron and the circuit board connected to ground via separate ground filters.

FIG. 10 shows the soldering station 110 with a separate ground filter 300, 350 for a circuit board and for a soldering iron, respectively. This embodiment may be preferable in cases where AC/DC converter and thermal regulator 115 of said soldering station 110 are themselves a generator of electrical noise.

Figure 11A:
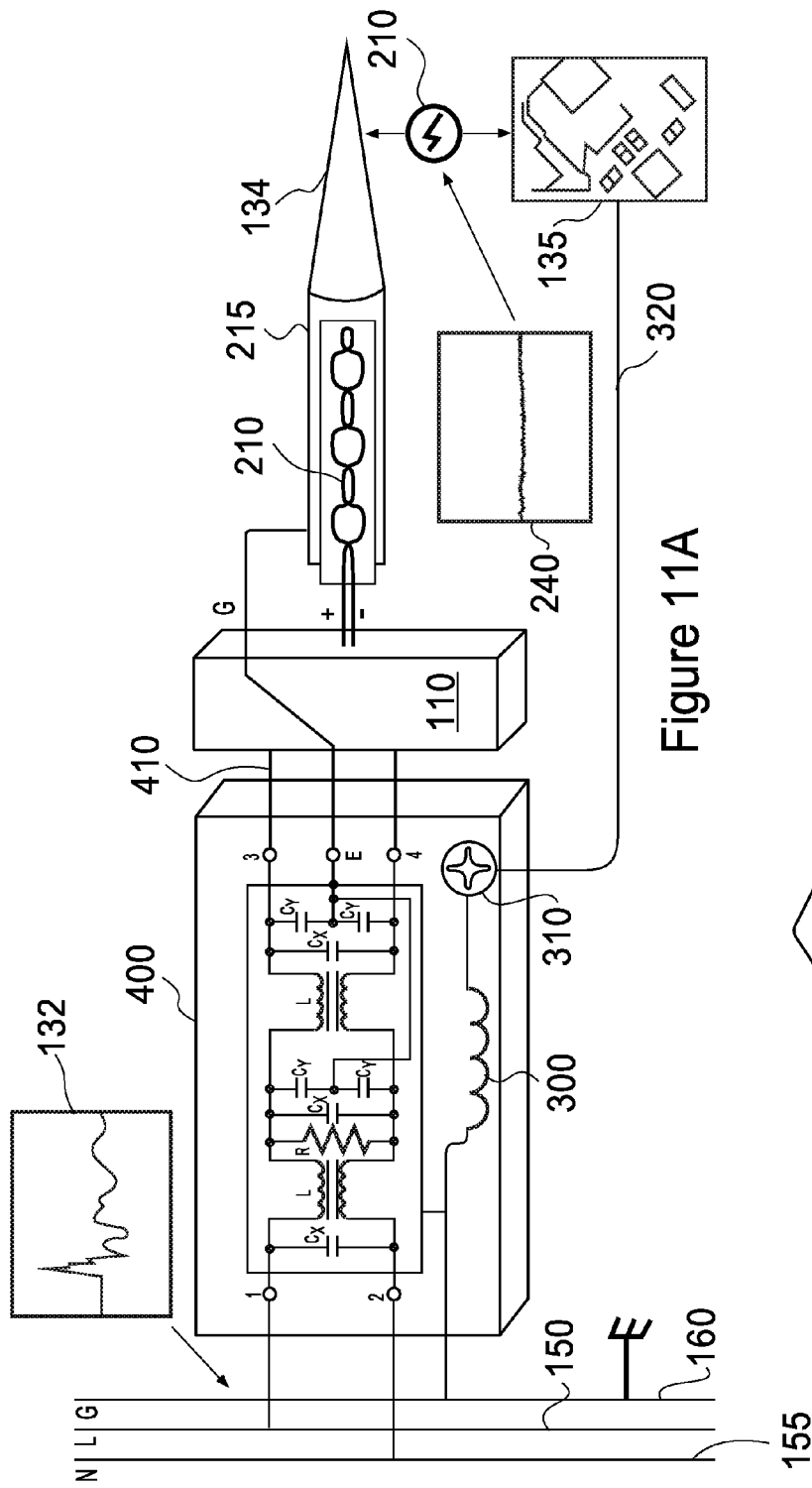
FIGS. 11A and 11B depict a soldering iron with a built-in ground filter.
Figure 11B:
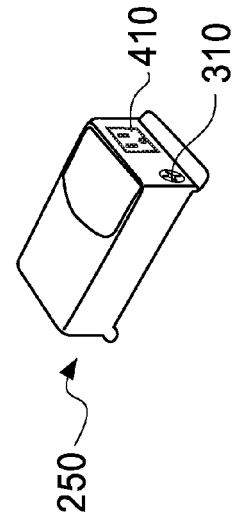

FIG. 11A depicts another embodiment of the device. In cases of existing soldering irons without ground filter in the base, an EMI filter 400 is used with the addition of the ground filter 300. The construction of the EMI filter can be of any type. The ground filter 300, while being a physical part of said EMI filter 400, is connected between ground and the terminal with the output for grounding the circuit board 135. In this embodiment, the ground of soldering iron is connected to the power line ground not through the said ground filter 300. This is an improvement over configuration of FIGS. 6 and 7, but with additional benefits constructively making a different type of purpose-specific EMI filter for soldering and similar applications. FIG. 11b shows an example of such EMI filter 400 with connection for the circuit board 310. Soldering iron plugs into filter's output 410.

Figure 12:
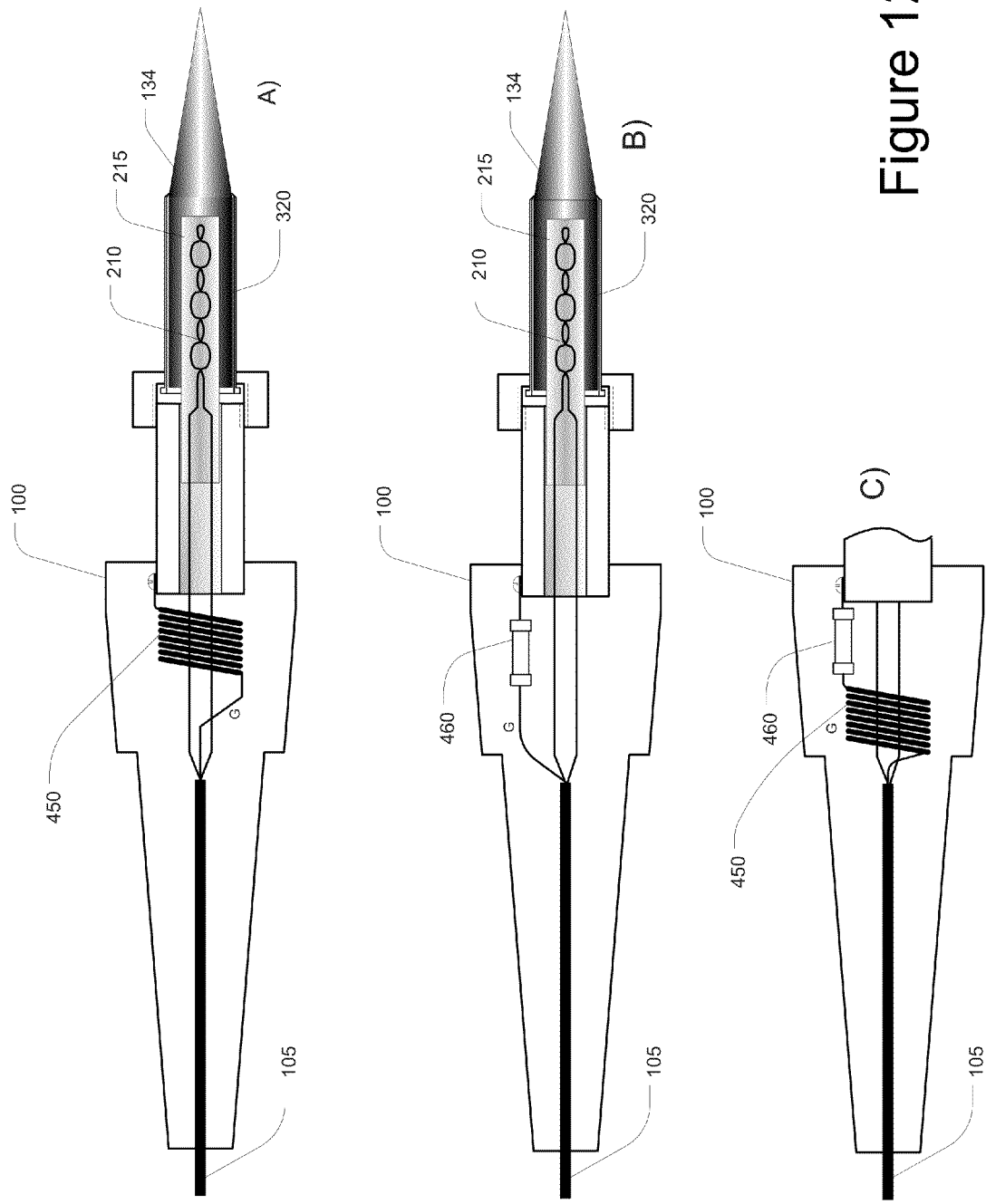
FIG. 12 shows a stand-alone ground filter connected between the circuit board and ground.

In order to reduce overstress current even further it is better to have ground filter as close to the contact point as possible. FIG. 12a depicts yet another embodiment of the device where ground filter 450, shown as inductor, is built into said soldering iron 100 itself. The output of said ground filter is electrically connected through elements of construction of the soldering iron to the tip 134. This way any high-frequency signal that may be picked up by said cable 105 between said soldering station and said soldering iron will be greatly reduced by said ground filter, in addition to reducing high-frequency noise coming from the power lines and the soldering station. FIG. 12b replaces said ground filter with resistor 460 where use of said ground filter is not feasible for whatever reason, such as limitations of the physical space. FIG. 12c exhibits a combination of said ground filter and said resistor connected in series, all being a part of said soldering iron.

Figure 13:
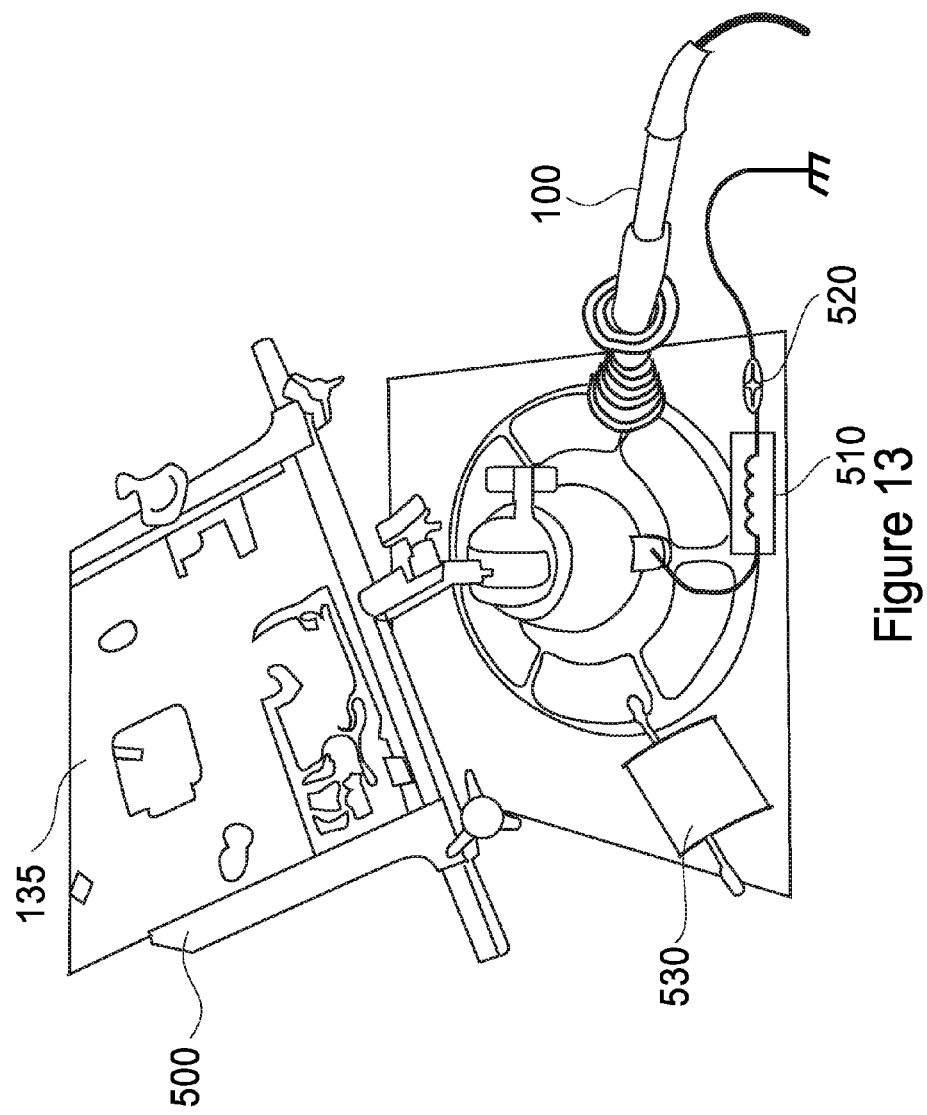

Soldering or similar operation is often done with the circuit board fixed in vise 500 as shown in FIG. 13, or other fixtures. Said circuit board can also be grounded via such vise. In FIG. 13, said ground filter 510 is mounted on vise (in this case on its foundation) and the output of said ground filter is electrically connected to said vise. Input of said filter is connected to terminal 520 which is electrically insulated from vise. Outside ground is connected to said terminal 520. This way the circuit board is connected to ground via ground filter that reduces high-frequency current from the soldering iron or other tool.

Figure 14:
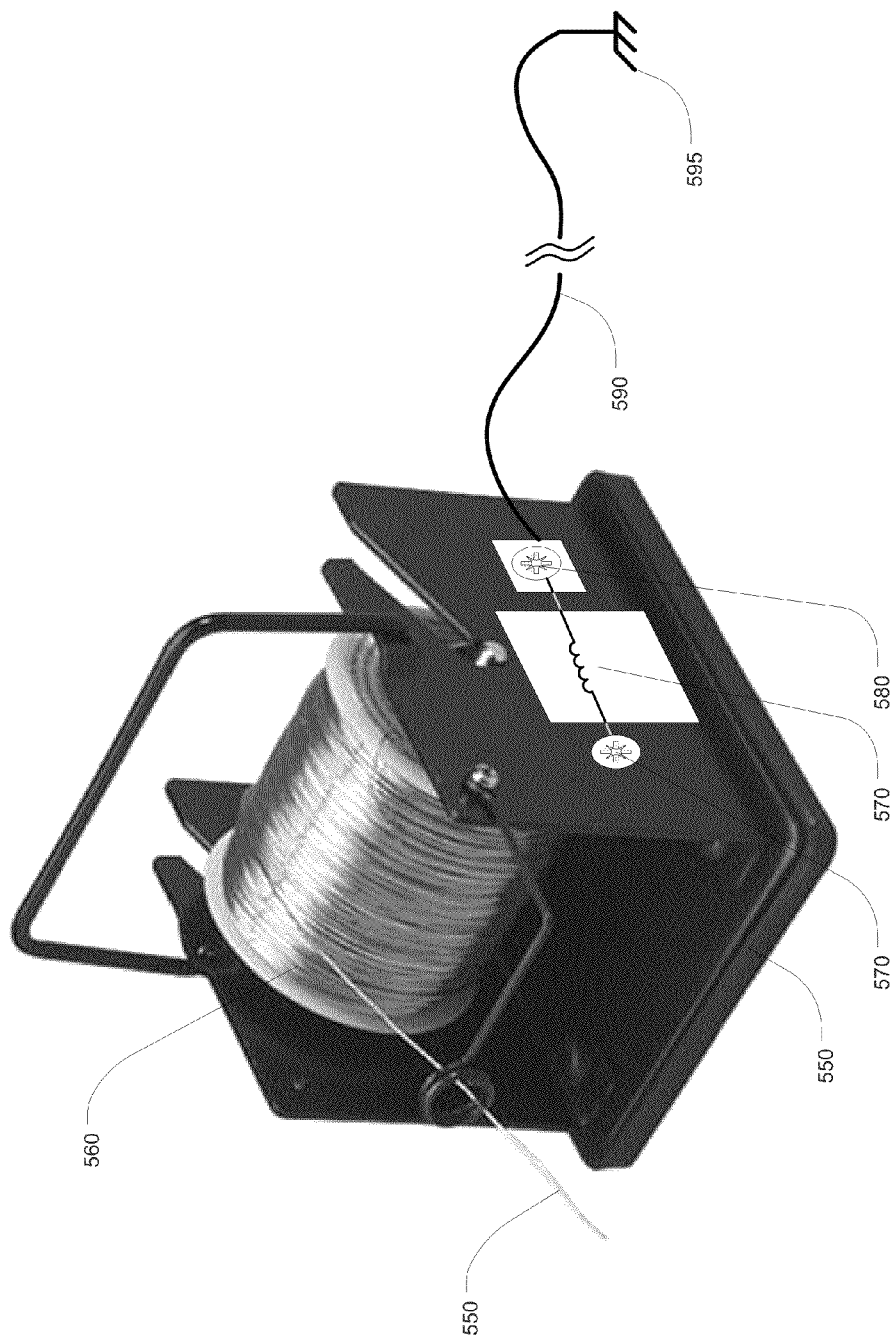

FIG. 14 shows yet another embodiment of the device. During soldering the solder 550 typically taken from the spool 560 which is mounted in a stand 550 comes in electric contact with the circuit board. In order to prevent electrical overstress, ground filter 570 is installed on said stand and its output is connected to said stand. Input of said filter is connected to an insulated from the stand terminal 580 and ground wire 590 is connected to said terminal. This way the circuit board is connected to ground via ground filter that reduces high-frequency current from the soldering iron.

Applications other than soldering can also greatly benefit from the proposed device and method. FIG. 15a shows a part of the wire bonding machine which bonds thin wires to pins of semiconductor devices. The bonding wire spool 600 is installed on the base of the tool 610. Exiting bonding wire 620 on its way to the bonding point passes by and physically touches sensor rod 630. The output of said sensor rod goes to control circuit of the bonding machine which determines presence of wire and other parameters. The spool of wire is grounded via said sensor rod via the control circuit (not shown). Said bonding wire comes in direct contact with the pins of the sensitive devices as shown in FIG. 15c. Thus, whenever high frequency voltage is passed from the control circuit to said sensor rod this voltage eventually ends up at the end of the bonding wire in contact with the pins and can cause undesirable parasitic high-frequency current. FIG. 15b shows another embodiment of the proposed device. Ground filter 650 is connected to said sensor rod and the other end of said ground filter is connected to the control circuit. Because ground filter has very low DC resistance, it does not affect normal operation of the control circuit but it blocks high-frequency currents from passing on to the wire.

Figure 16:
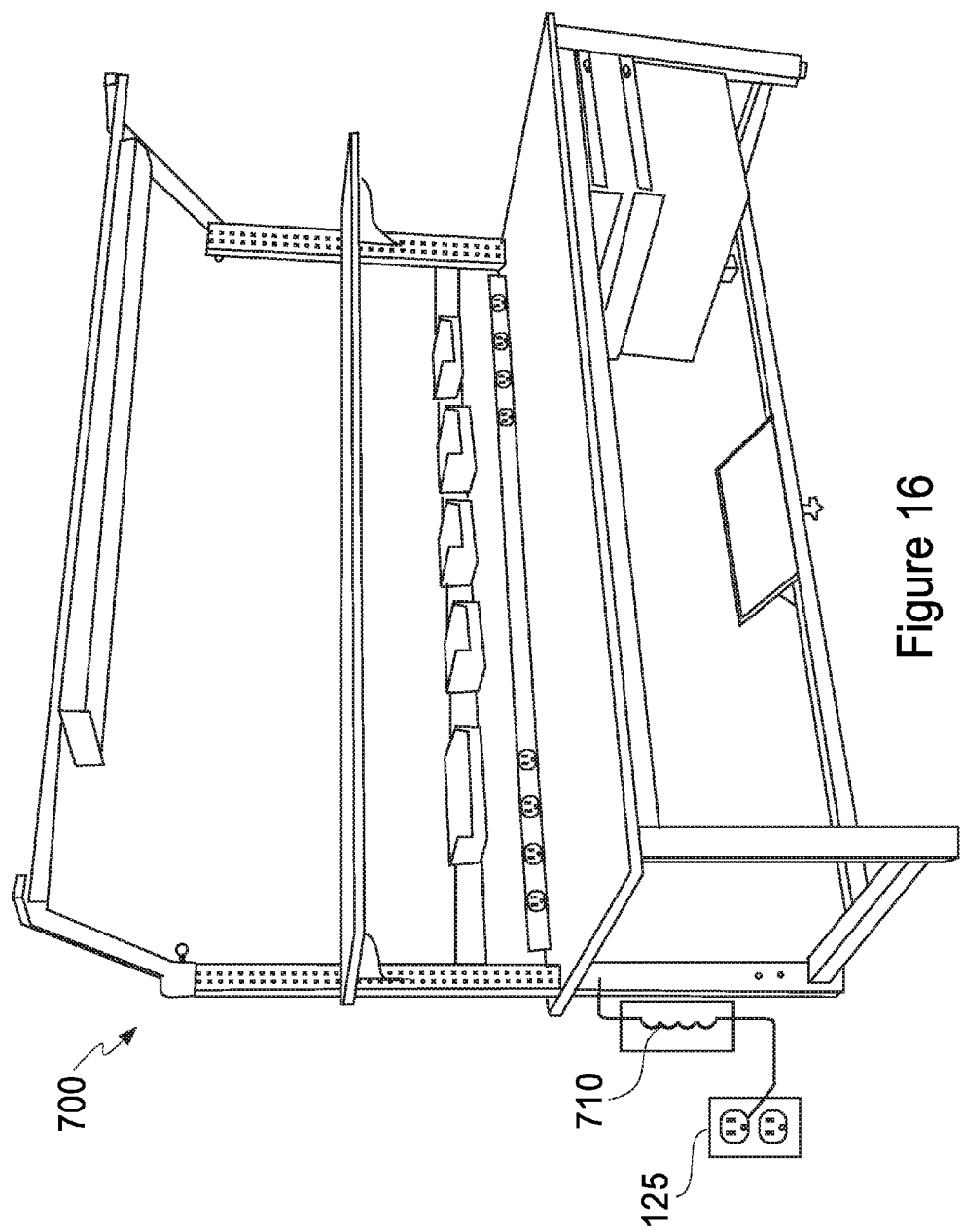
FIG. 16 depicts use of a ground filter with electronic workbench.

FIG. 16 shows use of ground filter with electronic workbench 700. Such workbenches are grounded in order to prevent damage from electrostatic discharge. Ground filter 710 installed on said workbench with output of said filter connected to conductive parts of the bench and input connected to ground shown in FIG. 16 as the central screw of said outlet 125 protects sensitive parts that are being worked on the bench. As seen, the device and method can be applied to a number of different equipment involved in manufacturing and/or handling of sensitive components. It should be obvious to the skilled in art how to apply proposed invention based on examples provided.

Figure 17:
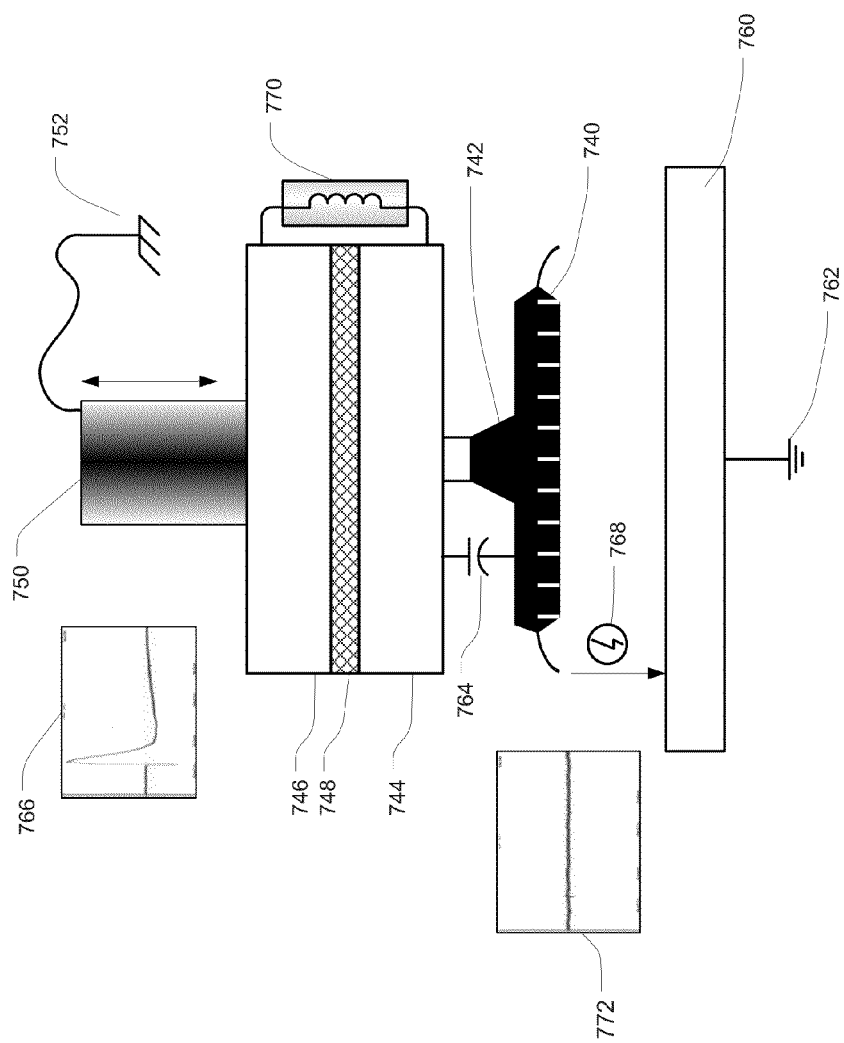
FIG. 17 illustrates another embodiment of the device used for the manufacture of semiconductor devices.

FIG. 17 depicts yet another embodiment of the proposed device. In manufacturing of semiconductor devices 740 the devices are being handled by vacuum cups 742 that are a part of robotic arm comprised often of a number of parts 744, 746, 748 and 750, where grounding of the final conductive member 744 that is in immediate proximity of the device is done through electrical connections between said members. Said device 740 comes in touch with the shuttle or IC test socket 760 which also has path to ground 762 which is often a different ground than said ground 752 from high frequency point of view. In case of high-frequency voltage on said ground 752 often caused by operation of electrical motors and alike inside the tool, this high-frequency voltage passes through parasitic capacitance 764 between said part 744 of said robotic arm and the substrate of said device 740, which results in current 768 between said device and said shuttle or socket. By electrically insulating the closest member 744 of said robotic arm with the insulating layer 748 or other means and connecting said member 744 to ground of the robotic arm via ground filter 770 current 772 between said device and said shuttle or socket 760 is greatly reduced.

While the foregoing has been with reference to a particular embodiment of the invention, it will be appreciated by those skilled in the art that changes in this embodiment may be made without departing from the principles and spirit of the disclosure, the scope of which is defined by the appended claims.

The invention claimed is:

1. A device for reducing electrical overstress in an electronic component tool that interacts with one of a component and a circuit board comprising:
   a ground filter having an input terminal and an output terminal, wherein each of the input terminal and output terminal is capable of being coupled to a ground of one of a printed circuit board and an electronic component tool; and
   wherein the ground filter, when coupled to one of the printed circuit board and the electronic component tool, reduces a current applied to the printed circuit board.

2. The device of claim 1, wherein the ground filter is an inductor.

3. The device of claim 2, wherein the ground filter further comprises a resistor.

4. The device of claim 1, wherein the ground filter also has a resistor.

5. The device of claim 1, wherein the ground filter is integrated into a soldering iron base and wherein the electronic component tool is a soldering iron connected to the soldering iron base.

6. The device of claim 1, wherein the electronic component tool is an EMI filter and the ground filter is housed in the EMI filter.

7. The device of claim 1, wherein the electronic component tool is a soldering iron base that houses the ground filter and a power filter.

8. The device of claim 1, wherein the electronic component tool is a soldering iron having a body and the ground filter is integrated into the body of the soldering iron.

9. The device of claim 8, wherein the body of the soldering iron is a handle of the soldering iron.

10. The device of claim 1, wherein the electronic component tool is a vise that incorporates the ground filter.

11. The device of claim 1, wherein the electronic component tool is a ground wire assembly that incorporates the ground filter.

12. The device of claim 1, wherein the electronic component tool is a work surface that incorporates the ground filter.

13. The device of claim 1, wherein the electronic component tool is a workbench that incorporates the ground filter.

14. The device of claim 1, wherein the electronic component tool is a solder holder that incorporates the ground filter.

15. The device of claim 1, wherein the electronic component tool is a wire bonder that incorporates the ground filter.

16. The device of claim 1, wherein the ground filter is connected to both the circuit board and the electronic component tool.

17. A method for reducing electrical overstress in an electronic component tool that interacts with one of a component and a circuit board, the method comprising:
   connecting a ground filter to a ground of an electronic component tool and one of a component, and a printed circuit board;
   reducing a current between one of the component and the printed circuit board and the electronic component tool using the ground filter.

18. The method of claim 17, wherein connecting the ground filter further comprises connecting an inductor.

19. The method of claim 17, wherein connecting the ground filter further comprises connecting an inductor and a resistor.

20. The method of claim 17, wherein connecting the ground filter further comprises connecting a resistor.

21. A method for fabricating a device for reducing electrical overstress from an electronic component tool that interacts with a circuit board, the method comprising:
   connecting a ground filter to an input terminal and an output terminal; and
   integrating the ground filter into an electronic component tool using the input terminal so that the current between the electronic component tool and the circuit board is reduced when the electronic component tool is used to work on the circuit board and housing the ground filter in an EMI filter.

22. The method of claim 21, wherein integrating the ground filter further comprises integrating the ground filter into a soldering iron base and wherein the electronic component tool is a soldering iron connected to the soldering iron base.

23. The method of claim 21, wherein integrating the ground filter further comprises housing the ground filter in a soldering iron base and housing a power line filter in the soldering iron base.

24. The method of claim 21, wherein integrating the ground filter further comprises integrating the ground filter into a handle of a soldering iron.

25. The method of claim 21, wherein integrating the ground filter further comprises integrating the ground filter into a vise.

26. The method of claim 21, wherein integrating the ground filter further comprises integrating the ground filter into a ground wire.

27. The method of claim 21, wherein integrating the ground filter further comprises integrating the ground filter into a work surface.

28. The method of claim 21, wherein integrating the ground filter further comprises integrating the ground filter into a workbench.

29. The method of claim 21, wherein integrating the ground filter further comprises integrating the ground filter into a solder holder.

30. The method of claim 21, wherein integrating the ground filter further comprises integrating the ground filter into a wire bonder.

31. A device for reducing electrical overstress in an electronic component tool that interacts with a semiconductor device, the device comprising:
   a ground filter having an input terminal and an output terminal capable of being coupled to a ground of a conductive member of the electronic component tool adjacent the semiconductor device, wherein the conductive member of the electronic component tool is a final conductive member immediately adjacent to the semiconductor device; and
   wherein the ground filter, when coupled to the conductive member of the electronic component tool, reduces a current applied to the semiconductor device.

32. The device of claim 31, wherein the electronic component tool is a robot.

33. A method for reducing electrical overstress in an electronic component tool that interacts with a semiconductor device, the method comprising:

connecting a ground filter to a ground of a conductive member of the electronic component tool adjacent the semiconductor device; and reducing a current between one of the electronic component tool and the semiconductor device using the ground filter.

34. The device of claim 32, wherein the conductive member of the electronic component tool is a final conductive member immediately adjacent to the semiconductor device.

35. The device of claim 32, wherein the electronic component tool is a robot.

* * * * *